United States Patent
Fujiya et al.

(10) Patent No.: US 7,623,346 B2
(45) Date of Patent: Nov. 24, 2009

(54) ELECTRONIC COMPONENT UNIT AND ELECTRONIC APPARATUS

(75) Inventors: Hiromitsu Fujiya, Kawasaki (JP); Hideki Kimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/153,583

(22) Filed: May 21, 2008

(65) Prior Publication Data
US 2008/0278910 A1 Nov. 13, 2008

Related U.S. Application Data

(62) Division of application No. 11/387,761, filed on Mar. 24, 2006, now Pat. No. 7,391,618.

(51) Int. Cl.
H05K 7/20 (2006.01)
H01L 23/36 (2006.01)

(52) U.S. Cl. .................. 361/694; 361/695; 361/697; 361/679.49; 361/727; 165/104.33; 165/104.34; 165/185; 165/122; 165/126; 454/184

(58) Field of Classification Search .......... 361/687, 361/690–697, 717–727; 165/104.33, 185, 165/121–126; 454/184; 174/35 R, 51
See application file for complete search history.

(56) References Cited

U.S. PATENT DOCUMENTS

| | | | |
|---|---|---|---|
| 6,058,011 A | 5/2000 | Hardt et al. | 361/694 |
| 6,504,718 B2 | 1/2003 | Wu | 361/695 |
| 6,556,438 B1 | 4/2003 | Bolognia et al. | 361/687 |
| 6,616,248 B2 | 9/2003 | Obuse et al. | 303/119.3 |
| 6,654,244 B2 | 11/2003 | Laufer et al. | 361/695 |
| 6,678,157 B1 | 1/2004 | Bestwick | 361/695 |
| 6,980,435 B2 | 12/2005 | Shum et al. | 361/695 |
| 6,999,312 B1 | 2/2006 | Garnett et al. | 361/687 |
| 7,061,761 B2 * | 6/2006 | Tucker et al. | 361/695 |
| 7,120,018 B2 | 10/2006 | Shen et al. | 361/695 |

FOREIGN PATENT DOCUMENTS

JP 405029782 A 2/1993

* cited by examiner

*Primary Examiner*—Michael V Datskovskiy
(74) *Attorney, Agent, or Firm*—Kratz, Quintos & Hanson, LLP

(57) ABSTRACT

Airflow is introduced into an enclosure through an air inlet in an electronic component unit. The airflow runs toward a first electronic component. The airflow absorbs heat from the first electronic component. The first electronic component is thus sufficiently cooled. A second electronic component is mounted on a printed wiring board at a position remoter from the air inlet than the position of the first electronic component. An air intake opening is formed in the enclosure. The air intake opening is defined at a section of the enclosure opposed to the printed wiring board at least between the first and second electronic components. Airflow is introduced toward the second electronic component through the air intake opening. The second electronic opening is thus sufficiently cooled. In this manner, the first and second electronic components are cooled equally to the utmost.

2 Claims, 7 Drawing Sheets

ELECTRONIC COMPONENT UNIT AND ELECTRONIC APPARATUS

CROSS-REFERENCE TO RELATED APPLICATIONS

This application is a Divisional of prior application Ser. No. 11/387,761 filed on Mar. 24, 2006, now U.S. Pat. No. 7,391,618 the entire contents of which are incorporated herein by reference.

BACKGROUND OF THE INVENTION

1. Field of the Invention

The present invention relates to an electronic component unit such as a system board unit incorporated in a server computer or the like.

2. Description of the Prior Art

A system board unit is incorporated in a server computer, for example. The system board unit includes a printed circuit board or system board. The system board includes central processing unit (CPU) chips mounted on a printed wiring board. A heat sink is received on the individual CPU chip. Airflow runs within the system board unit to cool the CPU chips. A fan is placed in the server computer 11 so as to generate the airflow. The CPU chips are arranged along the direction of the airflow, for example.

The airflow in the server computer absorbs heat from the heat sinks on the CPU chips at upstream positions. The airflow is thus heated. The heated airflow cannot sufficiently absorb heat from the CPU chips at downstream positions. This causes a rise in the temperature of the CPU chips at the downstream positions. The CPU chips at the downstream positions suffer from a reduced processing speed. Since the processing speeds of all the CPU chips are normally set equal, for example, the processing speed of the CPU chips at the upstream positions is leveled down to the processing speed of the CPU chips at the downstream positions.

SUMMARY OF THE INVENTION

It is accordingly an object of the present invention to provide an electronic component unit and an electronic apparatus allowing electronic components to get cooled quite equally.

According to a first aspect of the present invention, there is provided an electronic component unit comprising: an enclosure; an air inlet defined in the enclosure; a printed wiring board placed within the enclosure; a first electronic component mounted on the printed wiring board; a second electronic component mounted on the printed wiring board at a position remoter from the air inlet than the position of the first electronic component; and an opening defined in the enclosure at a section opposed to the printed wiring board between the first and second electronic components, the opening designed to such air into the enclosure.

The electronic component unit allows airflow to run into the enclosure through the air inlet. The airflow runs toward the first electronic component. The airflow absorbs heat from the first electronic component. The first electronic component is thus sufficiently cooled down. The second electronic component is mounted on the printed wiring board at a position remoter from the air inlet than the position of the first electronic component. The opening is formed in the enclosure for sucking air into the enclosure. The opening is defined in the enclosure at a section opposed to the printed wiring board between the first and second electronic components. Airflow is thus allowed to run toward the second electronic component through the opening. The second electronic component is sufficiently cooled down. Even though the second electronic component is placed at the position remoter from the air inlet than the position of the first electronic component, the first and second electronic components can be cooled quite equally.

The first and second electronic components may be placed in a first space extending from the air inlet in the electronic component unit. In this case, a guiding member may be placed in a second space extending from the air inlet in parallel with the first space. The guiding member may define an air guiding surface designed to guide airflow to the second electronic component.

The guiding member is placed within the second space parallel to the first space in the electronic component unit. The guiding member defines the air guiding surface designed to guide airflow to the second electronic component. Airflow is introduced into the second space through the air inlet. The airflow collides against the air guiding surface. The airflow is guided to the second electronic component along the air guiding surface. Even though the first and second electronic components are placed in the first space, the second component can sufficiently be cooled down. Airflow is also introduced into the first space through the air inlet. The airflow serves to sufficiently cool the first electronic component. The first and second electronic components can thus be cooled quite equally.

According to a second aspect of the present invention, there is provided an electronic component unit comprising: an enclosure; an air inlet defined in the enclosure; a printed wiring board placed within the enclosure; a first electronic component mounted on the printed wiring board, the first electronic component placed in a first space extending from the air inlet; a second electronic component mounted on the printed wiring board at a position remoter from the air inlet than the position of the first electronic component, the second electronic component placed in the first space; and a guiding member placed in a second space extending from the air inlet in parallel with the first space, the guiding member defining an air guiding surface designed to guide airflow to the second electronic component.

The electronic component unit allows airflow to run into the first space through the air inlet. The airflow runs toward the first electronic component. The airflow absorbs heat from the first electronic component. The first electronic component is thus sufficiently cooled down. The second electronic component is mounted on the printed wiring board at a position remoter from the air inlet than the position of the first electronic component. The guiding member is placed in the second space extending in parallel with the first space. The guiding member defines the air guiding surface designed to guide airflow to the second electronic component. Airflow is allowed to run into the second space through the air inlet. The airflow collides against the air guiding surface. The air guiding surface serves to direct the airflow to the second electronic component. The second electronic component can thus sufficiently be cooled down. Even though the first and second electronic components are placed in the first space, the first and second electronic components can be cooled quite equally.

The electronic component unit may further comprise a third electronic component mounted on the printed wiring board, the third electronic component placed in the second space. The second space may comprise a lower space defined on the surface of the printed wiring board, the lower space containing the third electronic component; and an upper space layered on the lower space on the printed wiring board, the upper space containing the guiding member.

Airflow introduced into the upper space is allowed to run toward the guiding member in the electronic component unit. The air guiding surface serves to direct the airflow toward the second electronic component. The second electronic component is thus sufficiently cooled down. The airflow introduced into the lower space runs along the third electronic component. The airflow absorbs heat from the third electronic component. Even though the guiding member is placed in the second space, the third electronic component can sufficiently get cooled. The inner space of the enclosure can efficiently be utilized. The air guiding surface may get remoter from the air inlet at a position closer to the second electronic component.

According to a third aspect of the present invention, there is provided an electronic component unit comprising: an enclosure; a first opening formed in the enclosure at a first end; a second opening formed in the enclosure at the first end at a position adjacent to the first opening; a third opening formed in the enclosure at a second end opposite to the first end; a first component placed in a first space defined between the first and third openings; a second component placed in a second space defined between the second and third openings; and a guiding member placed in a third space defined in the second space at a position adjacent to the first space.

The electronic component unit allows airflow to run from the first and second openings to the third opening, respectively. Airflow is allowed to run from the first opening to the first component in the first space. The airflow absorbs heat from the first component. The first component is thus cooled down. The third space is defined in the second space at the position adjacent to the first space. The guiding member is placed in the third space. The guiding member serves to guide airflow, for example. Airflow runs from the second opening to the second component in the second space regardless of the guiding member. The airflow serves to absorb heat from the second component. The second component is thus cooled down. The first and second electronic components can sufficiently get cooled in the enclosure in this manner.

The guiding member of the electronic component unit may have an end surface extending, from a position remote from the first space in the second space and close to the first end, toward a position close to the first space in the second space and close to the second end.

Airflow is introduced into the second space through the second opening. The airflow collides against the end surface. The end surface extends in the second space from the position remote from the first space to the position close to the first space. Simultaneously, the end surface extends from the position close to the first end to the position close to the second end. The airflow is thus directed to the first space from the second space. The airflow can be utilized to cool the first component. The airflow within the enclosure can efficiently be utilized.

The first component of the electronic component unit may comprise: a first component unit; and a second component unit placed at a position closer to the third opening than the position of the first component unit. In this case, the guiding member may have an end surface extending, from a position remote from the first space in the second space and close to the first end, toward a position close to the first space in the second space and close to the second end.

The first component comprises the first and second component units. The second component unit is placed at the position closer to the third opening than the position of the first component unit. The airflow runs through the first opening as described above. The airflow absorbs heat from the first component unit. The first component unit is thus cooled down. Simultaneously, airflow is allowed to run into the second space through the second opening. The airflow collides against the end surface. The end surface extends, from a position remote from the first space in the second space and close to the first end, toward a position close to the first space in the second space and close to the second end. The airflow can thus be directed to the second component unit in the first space from the second space. The airflow can be utilized to cool the second component unit. Even though the second component unit is placed at the position closer to the third opening than the position of the first component unit, the first and second component units can get cooled equally.

The electronic component unit may further comprise a fourth opening formed in the enclosure, the fourth opening being opened into the first space. In this case, the first component may comprise: a first component unit; and a second component unit placed at a position closer to the third opening than the first component unit is. The fourth opening may be formed in the enclosure at least between a position corresponding to the position of the first component unit and a position corresponding to the position of the second component unit. The electronic component unit allows airflow to run from the fourth opening to the second component unit. The airflow absorbs heat from the second component unit. The second component unit is thus cooled down. The first and second component units can get cooled quite equally in this manner.

The electronic component unit may be incorporated in an electronic apparatus. The electronic apparatus may comprise: an outer enclosure; and an electronic component unit attached to the outer enclosure. The electronic component unit may comprise: a unit enclosure; a first opening formed in the unit enclosure at a first end of the unit enclosure; a second opening formed in the unit enclosure at the first end at a position adjacent to the first opening; a third opening formed in the unit enclosure at a second end opposite to the first end; a first component placed in a first space defined between the first and third openings; a second component placed in a second space defined between the second and third openings; and a guiding member placed in a third space defined in the second space at a position adjacent to the first space. The electronic apparatus may further comprise a fan placed within the outer enclosure, the fan generating airflow running from the first and second openings toward the third opening.

According to a fourth aspect of the present invention, there is provided an electronic component unit comprising: an enclosure; a first component placed within the enclosure; a second component placed at a position closer to an end of the enclosure than the position of the first component; and an opening formed in the enclosure between a position corresponding to the position of the first component and a position corresponding to the position of the second component.

The second component is placed within the enclosure at the position closer to the end of the enclosure than the first component is. Airflow runs from the opening to the second component, for example. The airflow absorbs heat from the second component. The electronic component unit allows the second component to efficiently be cooled even if the first and second components are arranged.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
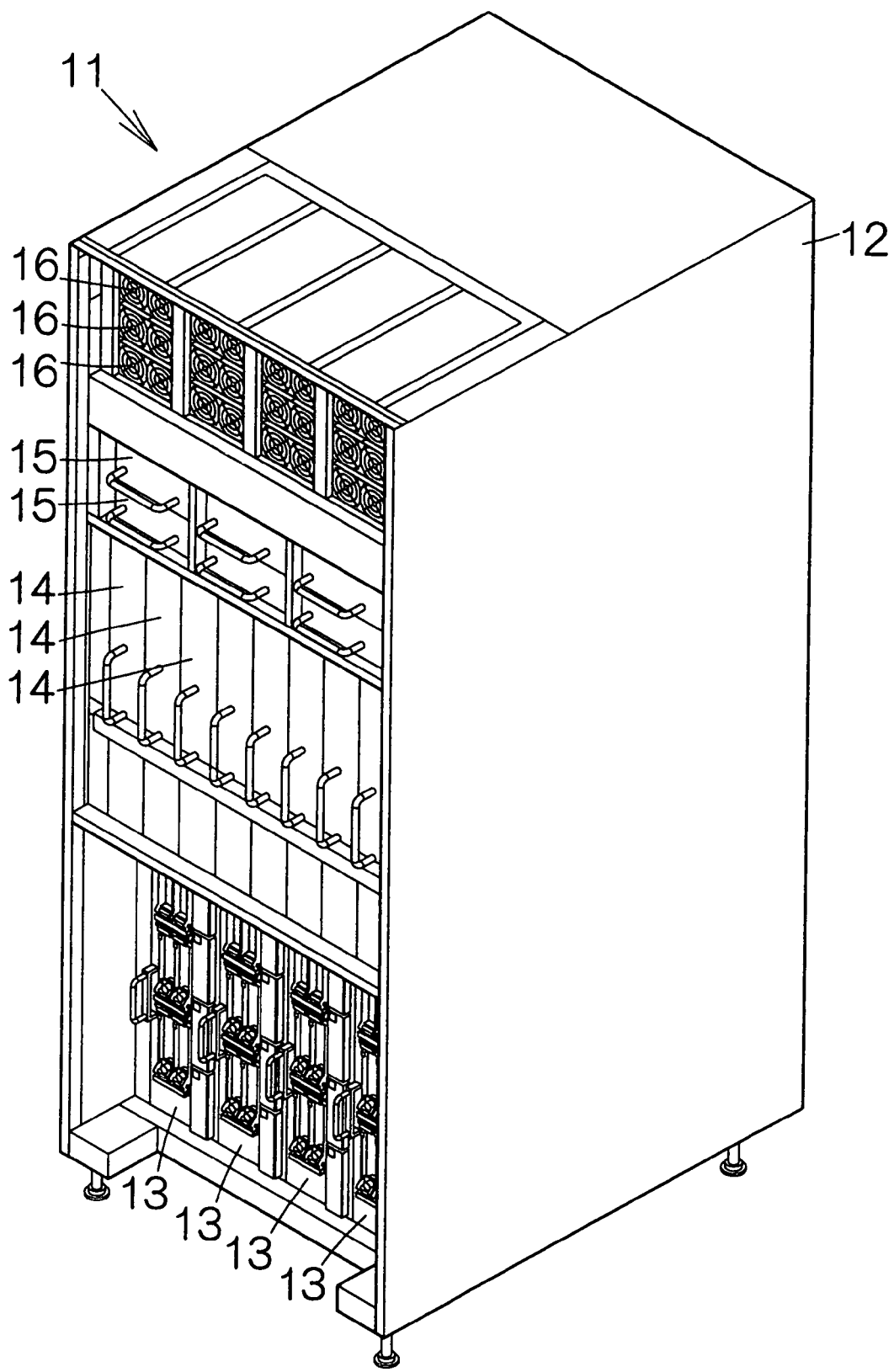
FIG. 1 is a perspective view schematically illustrating a server computer as a specific example of an electronic apparatus according to an embodiment of the present invention.

FIG. 1 schematically illustrates a server computer 11 as a specific example of an electronic apparatus according to an embodiment of the present invention. The server computer 11 includes an enclosure 12 as an external enclosure. Input/output units 13 are mounted on the lower rack of the enclosure 12. The individual input/output unit 13 includes a printed wiring board. The printed wiring board stands upright in the vertical direction perpendicular to the floor. A PCI board is for example incorporated in the individual input/output unit 13. A LAN cable or the like is coupled to the PCI board.

Electronic component units, namely system board units 14, are mounted on the middle rack of the enclosure 12. The system board units 14 are inserted into the enclosure 12 from the front of the enclosure 12. A back panel is placed in the enclosure 12. The individual system board unit 14 includes a connector is coupled to the back panel. The system board unit 14 includes a printed circuit board, namely a system board. The system board stands upright in the vertical direction perpendicular to the floor.

Fan units 15 are mounted on the upper rack of the enclosure 12. The individual fan unit 15 includes axial flow fans, for example. The fan unit 15 generates airflow in the enclosure 12 based on the rotation of the rotor in the individual axial flow fan. The rotation axes of the rotors extend in the vertical direction perpendicular to the floor. The generated airflow thus runs in the vertical direction from the bottom of the enclosure 12 toward the top of the enclosure 12. The airflow absorbs heat from the input/output units 13 and the system board units 14.

Power source units 16 are mounted on the uppermost rack of the enclosure 12. The server computer 11 is connected to an outlet through a cable. The power source units 16 serve to transform the alternating current supplied from the outlet into the direct current. The direct current is supplied to the fan units 15 and the aforementioned back panel. The back panel passes the direct current to the input/output units 13 and the system board units 14.

Figure 2:
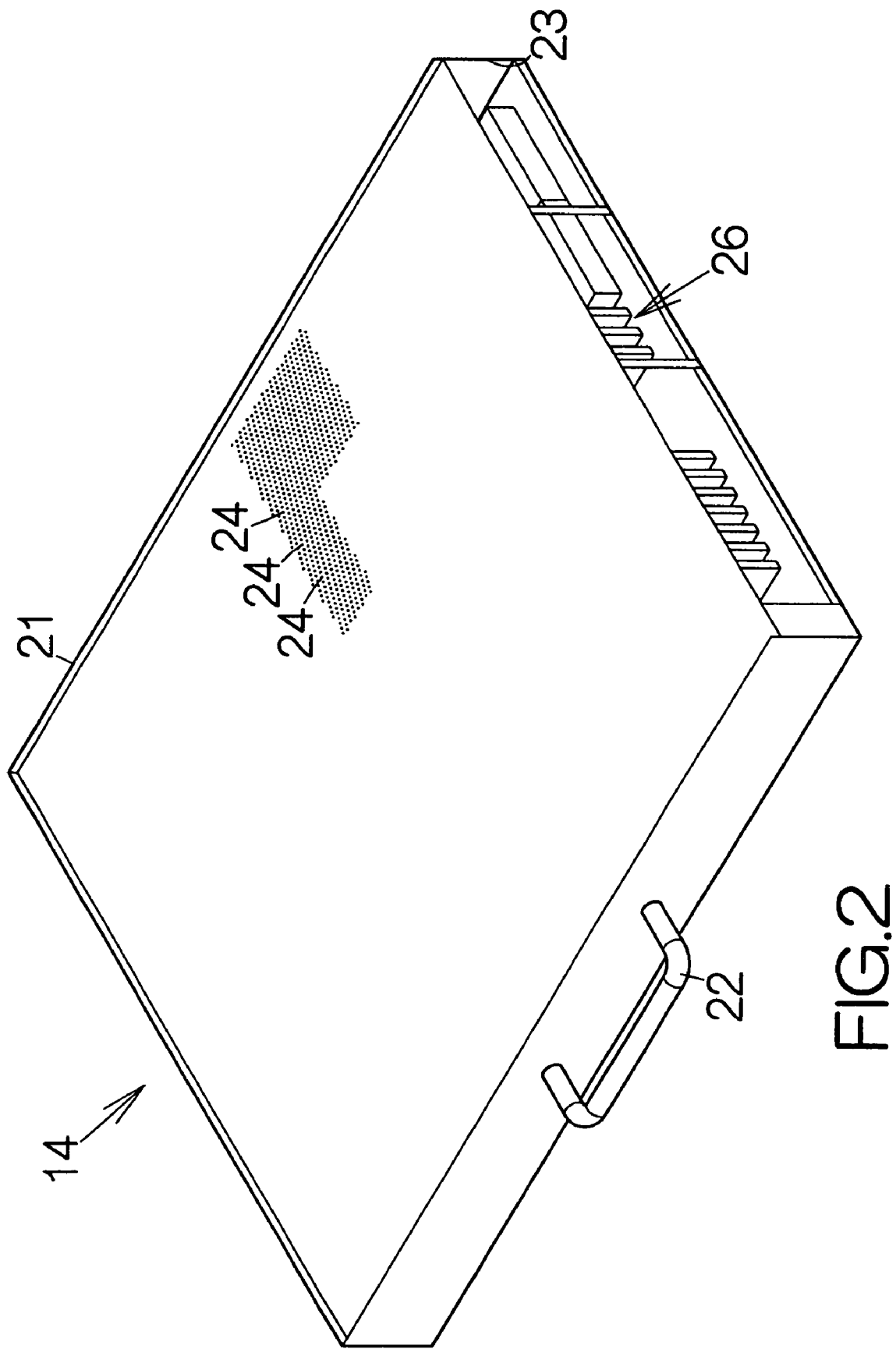
FIG. 2 is a perspective view schematically illustrating a system board unit as a specific example of an electronic component unit according to the present invention.

FIG. 2 is a perspective view schematically illustrating the system board unit 14. As shown in FIG. 2, the system board unit 14 includes a unit enclosure 21 defining an inner space in the form of a flat parallelepiped, for example. The unit enclosure 21 may be made of a metal plate such as a stainless steel or the like. A grip 22 is fixed to the front of the unit enclosure 21. One can hold the grip 22 to pull the system board unit 14 out of the server computer 11. When the system board unit 14 is mounted on the server computer 11, the unit enclosure 21 takes an upright attitude in the direction of gravity, namely in the vertical direction.

An opening, namely an air inlet 23, is defined at one side of the unit enclosure 21, namely at a first end. Airflow is introduced into the unit enclosure 21 through the air inlet 23 for cooling central processing unit (CPU) chips, for example. The air inlet 23 is opposed to the floor when the system board unit 14 is set in the upright attitude. A number of air intake openings 24 are also formed in the top plate of the unit enclosure 21 at a predetermined section. Airflow is also introduced into the unit enclosure 21 through the air intake openings 24 for cooling the CPU chips. The top plate of the unit enclosure 21 is opposed to the bottom plate of the adjacent unit enclosure 21 at a certain interval when the system board unit 14 is set in the aforementioned upright attitude.

Figure 3:
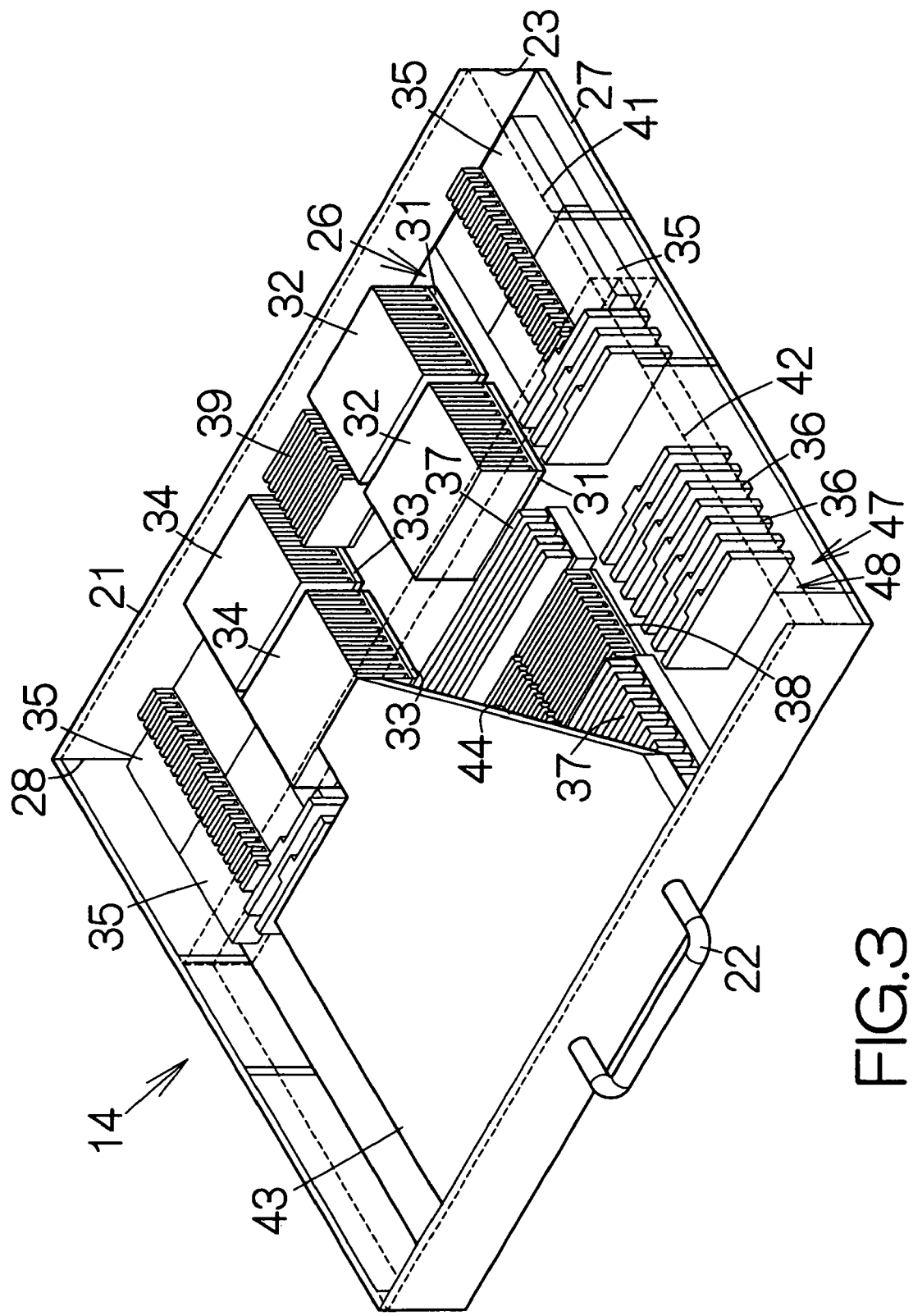
FIG. 3 is a perspective view schematically illustrating the inner structure of the system board unit.

A printed circuit board unit 26 namely the system board, is placed within the inner space of the unit enclosure 21. FIG. 3 schematically illustrates the inner structure of the system board unit 14. FIG. 3 shows the system board unit 14 without the top plate. As shown in FIG. 3, the printed circuit board unit 26 includes a printed wiring board 27. The printed wiring board 27 extends along the bottom plate of the unit enclosure 21. The printed wiring board 27 may rigidly be fixed to the bottom plate. The other side, namely a second end, is defined at a position opposite to the side defining the air inlet 23. An opening, namely an air outlet 28, is formed in the other side. A path of the airflow is established from the air inlet 23 and the air intake openings 24 to the air outlet 28, respectively.

First electronic components, namely first large-scale integrated circuit (LSI) packages 31, 31 are mounted on the surface of the printed wiring board 27. The first LSI packages 31, 31 are spaced from the air inlet 23 by a first distance. The first LSI packages 31, 31 are arranged side by side. The individual first LSI package 31 includes a CPU chip, not shown, mounted on a small-sized ceramic substrate or the like. The CPU chip executes various kinds of processing based on software programs and/or data temporarily stored in a memory, for example. The memory will be described later in detail.

A heat radiating member, namely a first heat sink 32, is received on the individual first LSI package 31. The first heat sink 32 includes a main body in the form of a flat plate, namely a heat plate, and fins standing upright in the vertical direction from the heat plate. Air passages are defined between adjacent ones of the fins. The air passages are set parallel to one another. The fins may extend in parallel with the front and back surfaces of the unit enclosure 21.

Second electronic components, namely second LSI packages 33, 33 are likewise mounted on the surface of the printed wiring board 27. The second LSI packages 33, 33 are spaced from the air inlet 23 by a second distance larger than the aforementioned first distance. The second LSI packages 33, 33 are arranged side by side. The individual second LSI package 33 includes a CPU chip mounted on a small-sized ceramic substrate or the like. A heat radiating member, namely a second heat sink 34, is received on the individual second LSI package 33. The second heat sink 34 may have the structure identical to the structure of the first heat sink 32.

Electronic circuit elements such as power source units 35, DC-DC converters 36, memory boards 37, controller chips 38 related to the memory boards 37, a chip set 39, or the like are mounted on the surface of the printed wiring board 27. Heat sinks are received on the individual power source unit 35, the individual controller chip 38 and the chip set 39, respectively. These heat sinks define air passages along the direction of the airflow.

Here, the first LSI package 31 serves as a first component unit of the present invention. The second LSI package 33 serves as a second component unit of the present invention. The first and second LSI packages 31, 33 serve as a first component of the present invention. The DC-DC converters 36, the memory boards 37 and the controller chips 38 serve as a second component of the present invention.

The chip set 39 is coupled to the aforementioned connector. Signals are supplied to the chip set 39 from the back panel. The chip set 39 serves to pass the signal to the first and second LSI packages 31, 33. It is desirable to exchange the signals between the chip set 39 and each of the CPU chips by the shortest distance. It is also desirable to locate the chip set 39 at a position closest to the back of the unit enclosure 21. Accordingly, the first LSI packages 31 are located away from the air inlet 23 by a distance different from the distance between the air inlet 23 and the second LSI packages 33.

As is apparent from FIG. 3, first and second spaces 41, 42 are defined in the unit enclosure 21. The first and second spaced 41, 42 are designed to extend from the air inlet 23 to the air outlet 28, respectively. The first and second spaces 41, 42 are arranged side by side. The first space 41 is defined along the back of the unit enclosure 21. Specifically, the first space 41 is defined on the backside of the system board unit 14. The second space 42 is defined along the front of the unit enclosure 21. Specifically, the second space 42 is defined on the foreside of the system board unit 14. The first and second LSI packages 31, 33, the power source units 35, and the chip set 39 are placed in the first space 41.

The second space 42 includes a lower space 47 defined along the surface of the printed wiring board 27 and an upper space 48 defined along the top plate of the unit enclosure 21. The lower and upper spaces 47, 48 are located adjacent to the first space 41. The lower space 47 is interposed between the upper space 48 and the surface of the printed wiring board 27. Third electronic components such as the memory boards 37 and the controller chips 38 are placed in the lower space 47. The height of the memory boards 37 and the controller chips 38 from the surface of the printed wiring board 27 is set smaller than that of the first and second heat sinks 32, 34.

A guiding member 43 is placed in the upper space 48. Specifically, the guiding member 43 is placed in a space between the top plate of the unit enclosure 21 and the upper ends of the memory boards 37 and the controller chips 38. The guiding member 43 is attached to the ceiling of the unit enclosure 21, for example. An adhesive is for example utilized for the attachment. The guiding member 43 may be made of a light resin material such as an expanded polystyrene or the like. The guiding member 43 serves to guide airflow introduced from the air inlet 23 opened at the second space 42. The thickness of the guiding member 43 is set identical to that of the upper space 48.

The guiding member 43 defines an air guiding surface 44 at its front end surface opposed to the air inlet 23. The air guiding surface 44 is inclined relative to the direction of the airflow running straight from the air inlet 23 to the air outlet 28. The air guiding surface 44 extends toward the fins of the second heat sinks 34. A side surface of the guiding member 43 may contact with the side surface of the fin of the second heat sink 34. The opposite side surface of the guiding member 43 may contact with the front wall of the unit enclosure 21.

The air guiding surface 44 gets closer to the air outlet 28 at a position closer to the back of the unit enclosure 21 away from the front of the unit enclosure 21. The air guiding surface 44 extends from a position remote from the first space 41 in the second space 42 toward a position close to the first space 41 in the second space 42. Likewise, the air guiding surface 44 gets remoter from the air inlet 23 at a position closer to the second heat sinks 34. In other words, the air guiding surface 44 extends from a position close to one side of the unit enclosure 21 to a position close to the other side of the unit enclosure 21.

Figure 4:
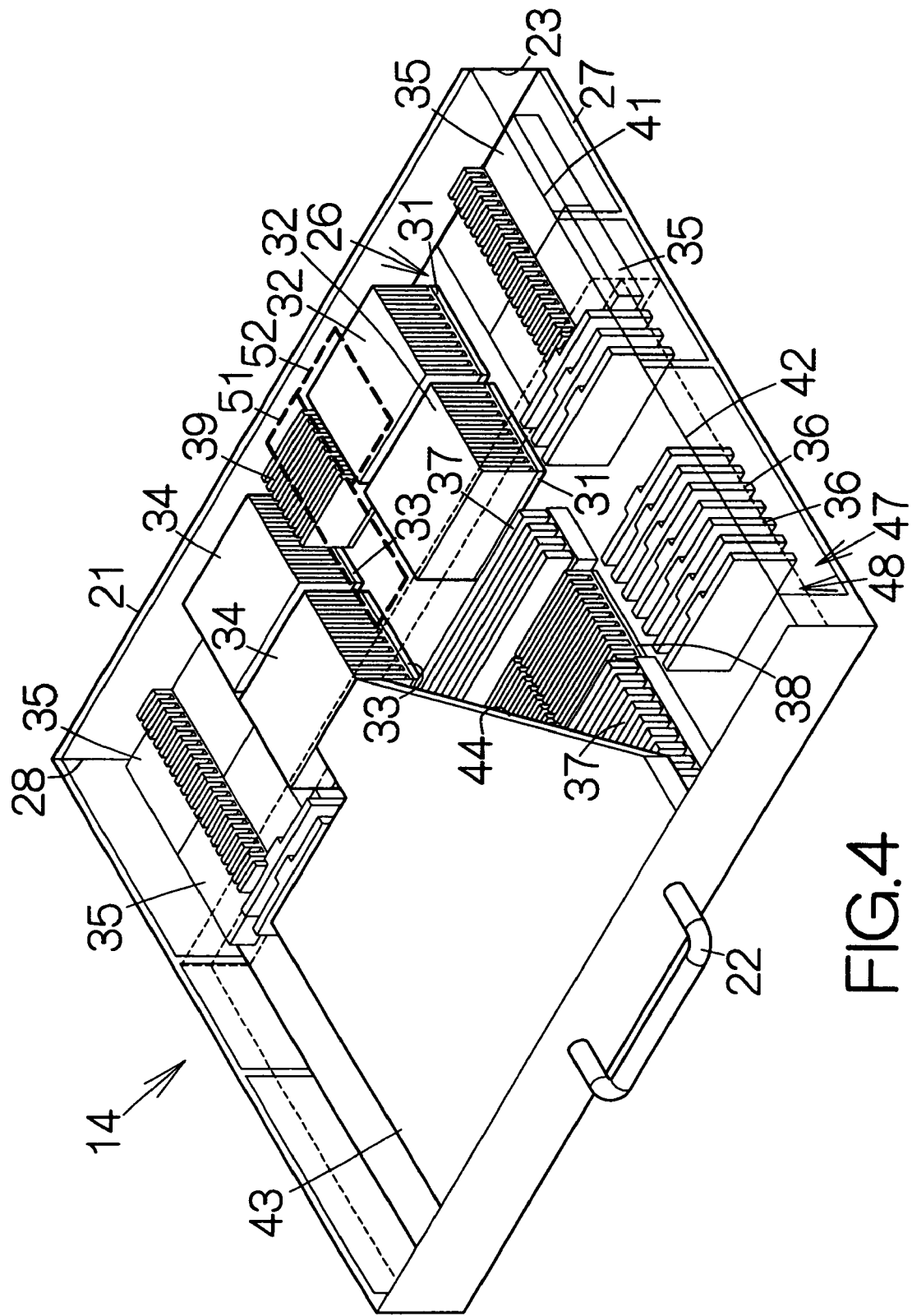
FIG. 4 is a perspective view illustrating the position of air inlet openings defined in the top plate of an enclosure.

FIG. 4 schematically illustrates the position of the air intake openings 24. As shown in FIG. 4, the aforementioned air intake openings 24 are formed in the top plate of the unit enclosure 21 at a first section 51 opposed to the surface of the printed wiring board 27 between the first and second heat sinks 32, 34. A second section 52 is defined on the top plate of the unit enclosure 21 at a position adjacent to the first section 51. The second section 52 is located closer to the air inlet 23 than the first section 51 is. The second section 52 is opposed to the top of the first heat sink 32 located at the position adjacent to the back of the unit enclosure 21.

The widths of the first and second sections 51, 52 are measured in the direction from the front of the unit enclosure 21 toward the back of the unit enclosure 21, respectively. The width of the first section 51 depends on that of the second section 52. The width of the first section 51 corresponds to twice the width of the second heat sink 34 according to the embodiment. The width of the second section 52 corresponds to that of the second heat sink 34. The width of the second heat sink 34 is likewise measured in the direction from the front toward the back of the unit enclosure 21.

Now, assume that airflow is generated in the enclosure 12 of the server computer 11. The airflow generated in the fan units 15 runs in the vertical direction from the bottom toward the top of the enclosure 12 as described above. The unit enclosure 21 of the individual system board unit 14 takes the upright attitude in the enclosure 12 of the server computer 11. The air inlet 23 is directed to the floor. The vertical airflow from the bottom of the enclosure 12 is introduced into the unit enclosure 21 of the system board unit 14 through the air inlet 23.

Figure 5:
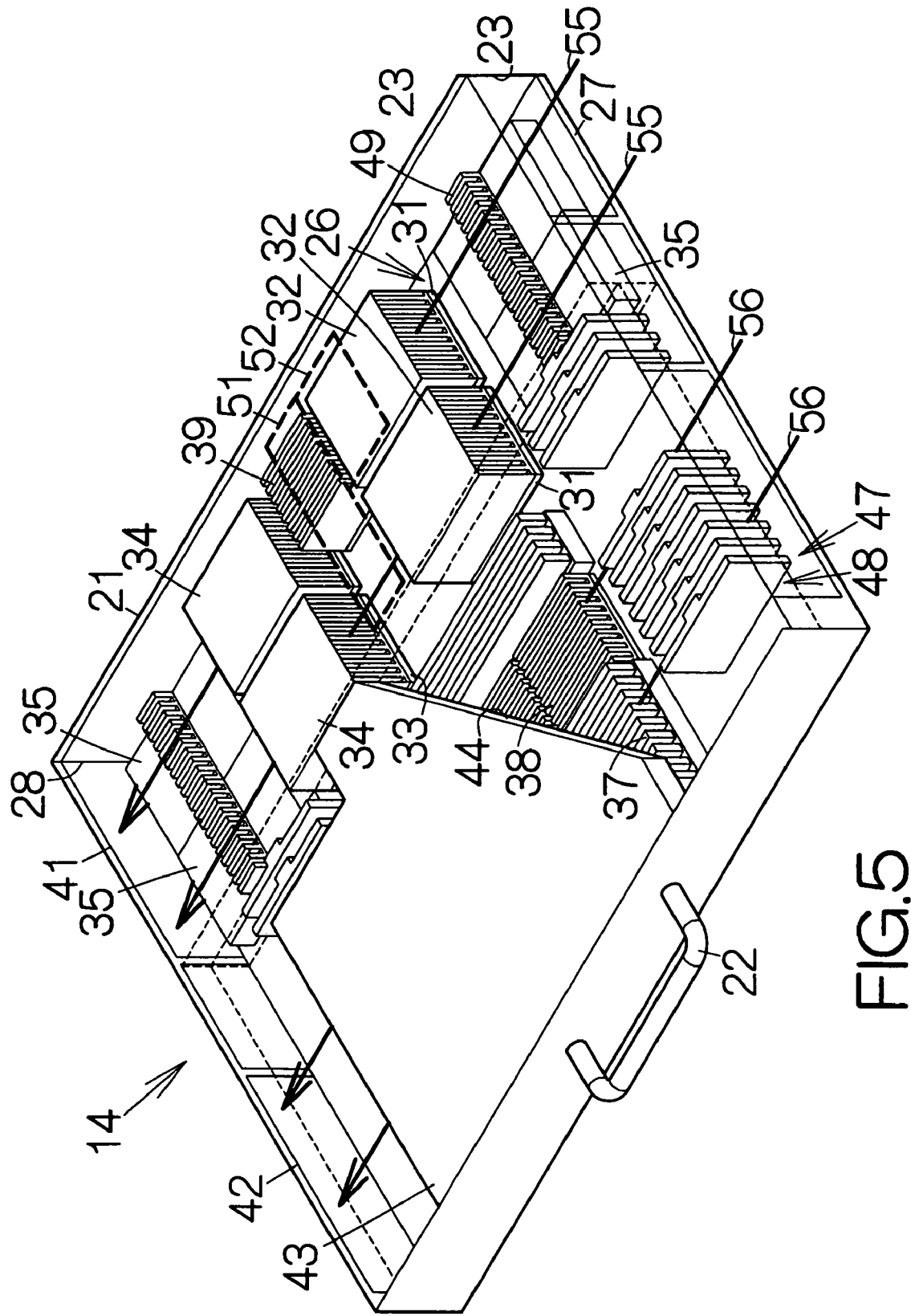
FIG. 5; is a perspective view schematically illustrating airflow running through first and second spaces.

FIG. 5 schematically illustrates the airflow within the unit enclosure 21. As shown in FIG. 5, airflow 55 runs into the first space 41 through the air inlet 23. The heat of the first LSI packages 31 is transferred to the first heat sinks 32, respectively. The airflow 55 absorbs the heat from the fins of the first heat sinks 32. The first LSI packages 31 thus get cooled. The first LSI packages 31 are prevented from a rise in temperature. The airflow 55 then runs toward the air outlet 28 from the first heat sinks 32. The airflow 55 is discharged out of the air outlet 28. It should be noted that the airflow 55 also serves to cool components other than the first LSI packages 31 placed on the path of the airflow 55.

Airflow 56 likewise runs into the lower space 47 of the second space 42 through the air inlet 23. The airflow 56 runs along the memory boards 37 and the air passages of the heat sinks on the controller chips 38. The airflow 56 absorbs heat from the memory board 37 and the fins of the heat sinks on the controller chips 38. The memory boards 37 and the controller chips 38 thus get cooled. The memory boards 37 and the controller chips 38 are prevented from a rise in temperature. The airflow 56 is then discharged out of the air outlet 28.

Figure 6:
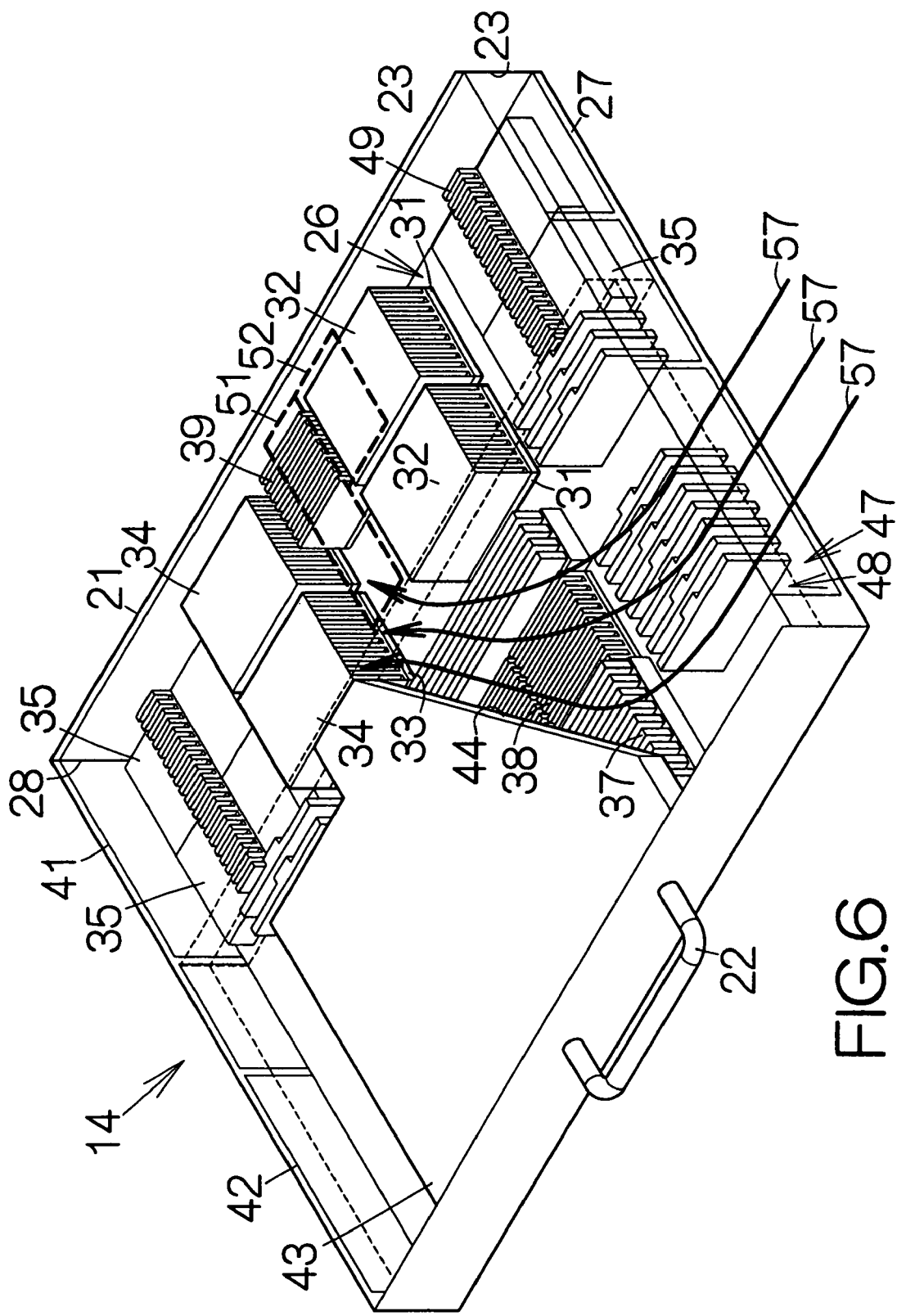
FIG. 6 is a perspective view schematically illustrating airflow running through the second space.

As shown in FIG. 6, airflow 57 also runs into the upper space 48 of the second space 47 through the air inlet 23. The airflow 57 collides against the air guiding surface 44. The air guiding surface 44 gets remoter from the air inlet 23 at a position closer to the second heat sinks 34, so that the airflow 57 is guided to the second heat sinks 34 along the air guiding surface 44. The airflow 57 absorbs heat from the fins of the second heat sinks 34. The second LSI packages 33 thus get cooled. The second LSI packages 33 are prevented from a rise in temperature. The airflow 57 is then discharged out of the air outlet 28.

The airflow 57 is allowed to run into the upper space 48 of the second space 42 as described above. The airflow 57 thus fails to touch the first LSI packages 31 as large heat sources placed in the first space 41. Likewise, the airflow 57 fails to touch the memory boards 37 and the controller chips 38 placed in the lower space 47 of the second space 42. The airflow 57 thus reaches the second heat sinks 34 without absorbing a larger amount of heat. The airflow 57 is allowed to efficiently cool only the second LSI packages 33.

Figure 7:
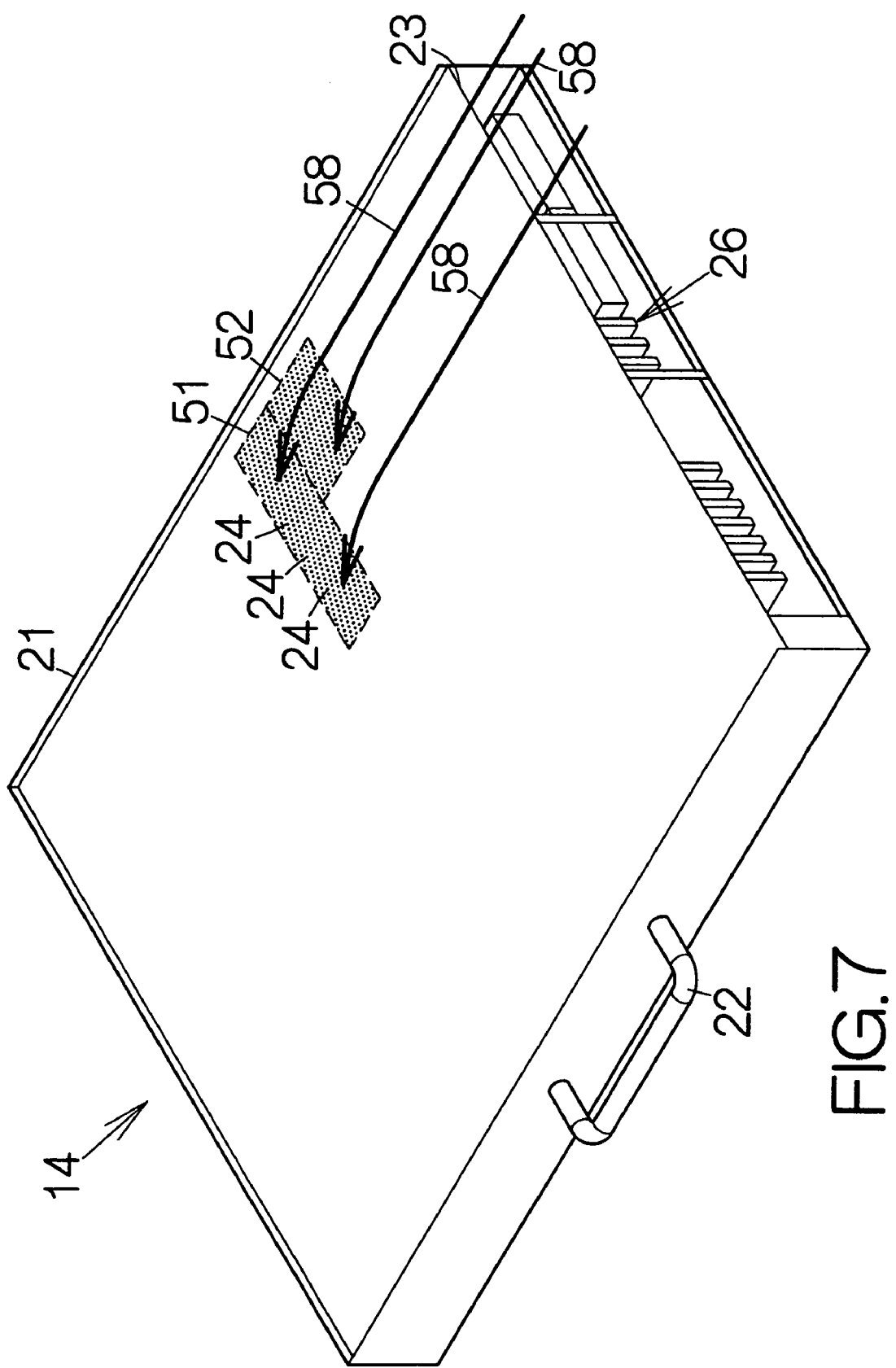
FIG. 7 is a perspective view schematically illustrating airflow introduced into the enclosure through the air intake openings.

The system board units 14 are placed within the enclosure 12. The intervals or gaps are defined between adjacent ones of the system board units 14 as described above. As shown in FIG. 7, airflow 58 from the bottom of the enclosure 12 is introduced into the gaps. The airflow 58 is allowed to run into the unit enclosure 21 of the individual system board unit 14 through the air intake openings 24. Since the air intake openings 24 are located in the first section 51 established between the first and second heat sinks 32, 34 as shown in FIG. 4, the airflow 58 reaches the second heat sinks 34, 34 without absorbing heat from the first heat sinks 32. The airflow 58 absorbs heat from the second heat sinks 34. The second LSI packages 33 are thus prevented from a rise in temperature.

The airflow 58 is also allowed to run through the air intake openings 24 at the second section 52 toward the chip set 39. Since the airflow 58 reaches the chip set 39 without absorbing heat from other components, the airflow 58 efficiently absorbs heat from the fins of the heat sink on the chip set 39. The chip set 39 is thus prevented from a rise in temperature. Even though the first LSI packages 31, the chip set 39 and the second LSI packages 33 are arranged in this sequence from a position near the air inlet 23 to a position near the air outlet 28, the second heat sinks 34 on the second LSI packages 33 and the heat sink on the chip set 39 enjoy an unheated airflow.

The server computer 11 allows the airflow 55 to run toward the first heat sinks 32 from the air inlet 23. The first LSI packages 31 thus sufficiently get cooled. The server computer 11 also allows the airflow 57 to run toward the second heat sinks 34 from the air inlet 23 with the assistance of the air guiding surface 44. The airflow 58 is also allowed to run toward the second heat sinks 34 from the air intake openings 24. The second LSI packages 33 thus sufficiently get cooled. Even though the second LSI packages 33 are placed downstream of the first LSI packages 31, the first and second LSI packages 31, 33 can get cooled quite equally. The processing speed of the CPU chips can thus be enhanced.

What is claimed is:

1. An electronic apparatus comprising:
    an outer enclosure; and
    an electronic component unit attached to the outer enclosure, wherein said electronic component unit comprising:
    a unit enclosure;
    a first opening formed in the unit enclosure at a first end of the unit enclosure;
    a second opening formed in the unit enclosure at the first end at a position adjacent to the first opening;
    a third opening formed in the unit enclosure at a second end opposite to the first end;
    a first component placed in a first space defined between the first and third openings;
    a second component placed in a second space defined between the second and third openings; and
    a guiding member placed in an upper space included in the second space at a position adjacent to the first space, the guiding member having an end surface extending, from a position remote from the first space in the second space and close to the first end, toward a position close to the first space in the second space and close to the second end.

2. The electronic apparatus according to claim 1, further comprising a fan placed within the outer enclosure, said fan generating airflow running from the first and second openings toward the third opening.

* * * * *